(12) United States Patent
Ozeki et al.

(10) Patent No.: US 7,498,658 B2
(45) Date of Patent: Mar. 3, 2009

(54) TRENCH GATE TYPE INSULATED GATE BIPOLAR TRANSISTOR

(75) Inventors: Yoshihiko Ozeki, Nukata (JP); Kensaku Yamamoto, Chiryu (JP)

(73) Assignee: DENSO CORPORATION, Kariya (JP)

( * ) Notice: Subject to any disclaimer, the term of this patent is extended or adjusted under 35 U.S.C. 154(b) by 108 days.

(21) Appl. No.: 11/402,874

(22) Filed: Apr. 13, 2006

(65) Prior Publication Data
US 2006/0244104 A1    Nov. 2, 2006

(30) Foreign Application Priority Data
Apr. 28, 2005    (JP) .............................. 2005-132218

(51) Int. Cl.
*H01L 21/331*    (2006.01)

(52) U.S. Cl. ............... 257/587; 438/133; 257/E29.066; 257/E29.197; 257/E29.201; 257/E21.382

(58) Field of Classification Search ................. 438/133, 438/135, 138; 257/133, 163, E29.066, E29.197, 257/E29.201, E21.382
See application file for complete search history.

(56) References Cited

U.S. PATENT DOCUMENTS 6,060,747 A * 5/2000 Okumura et al. ............ 257/331
6,737,705 B2   5/2004 Momota et al.
6,809,349 B2 * 10/2004 Yamaguchi et al. ......... 257/133
7,078,740 B2 *  7/2006 Yamaguchi et al. ......... 257/133

FOREIGN PATENT DOCUMENTS

JP    A-2003-204066    7/2003

* cited by examiner

*Primary Examiner*—Matthew S. Smith
*Assistant Examiner*—Phillip Green
(74) *Attorney, Agent, or Firm*—Posz Law Group, PLC

(57) ABSTRACT

A trench gate type IGBT includes: a first semiconductor layer; a second semiconductor on the first semiconductor layer; a third semiconductor on the second semiconductor layer; trenches for separating the third semiconductor layer into first regions and second regions; a gate insulation film on an inner wall of each trench; a gate electrode on the gate insulation film; a fourth semiconductor layer in a surface portion of each first region and contacting each trench; a first electrode connecting to the first region and the fourth semiconductor layer; and a second electrode connecting to the first semiconductor layer. The first regions and the second regions are alternately arranged. Two second regions are continuously connected together to be integrated into one body.

11 Claims, 7 Drawing Sheets

TRENCH GATE TYPE INSULATED GATE BIPOLAR TRANSISTOR

CROSS REFERENCE TO RELATED APPLICATION

This application is based on Japanese Patent Application No. 2005-132218 filed on Apr. 28, 2005, the disclosure of which is incorporated herein by reference.

FIELD OF THE INVENTION

The present invention relates to a trench gate type insulated gate bipolar transistor.

BACKGROUND OF THE INVENTION

As one of the trench-gate type IGBTs, a so-called thinning structure has been given as described below, in which with respect to a structure where a plurality of cell regions that act as IGBT elements are continuously disposed, certain cell regions are periodically thinned out from the plurality of continuous cell regions. This structure is disclosed in, for example, U.S. Pat. No., 6,737,705 and Japanese Patent Application Publication No. 2003-204066. Specifically, in the thinning structure, some cell regions are removed periodically from continuously arranged multiple cells.

The above IGBT has a $P^+$-type substrate, an $N^-$-type drift layer disposed on a surface of the $P^+$-type substrate, a P-type base region disposed on a surface of the $N^-$-type drift layer, $N^+$-type emitter regions situated at an inner surface side of the P-type base region, trenches in a depth from a surface of the P-type base region to the $N^-$-type drift layer through the $N^+$-type emitter regions and the P-type base region, gate insulating films formed on inner walls of the trenches, gate electrodes formed within the trench and on the gate insulating film, an emitter electrode disposed on the surface of the P-type base region and electrically connected to a part of the P-type base region and the $N^+$-type emitter regions, and a collector electrode disposed immediately on a back of the $P^+$-type substrate and electrically connected to the $P^+$-type substrate.

In the IGBT, the P-type base region is electrically divided into two types of regions (i.e., a first and a second regions) by the trenches, and the $N^+$-type emitter regions and a P-type body region are formed in only one region (i.e., first region) between the two types of regions. The first region is electrically connected to the emitter electrode via the P-type body region. The $N^+$-type emitter regions are disposed partially in a region near the trenches in the first region and channels are formed in portions where the region is contacted to the trenches. The first region in which an IGBT element is formed in this way corresponds to the cell region.

In the layout of the IGBT, a plurality of first regions and second regions of the P-type base regions are alternately disposed in a stripe pattern, and each of the second regions is enclosed by the trench.

In this way, as one of structures of the IGBT, a structure may be considered, in which each of the second regions is enclosed by the trench, thereby each of the second regions is configured by an independent P-type well and electrically isolated from the first regions or the second regions.

However, when the IGBT is formed in the above layout structure, the following two difficulties may be considered to arise.

That is, since each of the second regions is separated, electrical potential of each of the second regions is sometimes varied, for example, during switching operation of the IGBT. Therefore, a difficulty that operation of each cell within an IC chip becomes uneven may arise.

When a floating condition of each of the second regions is tested, since a plurality of second regions are tested at the same time, a method may be considered, in which each of the second regions is provided with a contact, and the second regions are electrically connected to each together by metal wiring such as Al wiring. Thus, for example, one test pad that has been electrically connected to the second regions is electrically connected to a tester, thereby a test can be easily performed.

However, when a special wiring line for electrically connecting the second regions to each together is provided within the IC chip, since restriction is caused in a layout of other wiring lines, a difficulty of decrease in degree of freedom may arise in a wiring layout.

Even when each of the second regions of the P-type base regions is configured by a separated P-type well enclosing each of the second regions by the trench, and separating the P-type wells forming respective second regions from one another, the difficulties may arise again.

SUMMARY OF THE INVENTION

In view of the above-described problem, it is an object of the present invention to provide a trench gate type insulated gate bipolar transistor having high degree of freedom of wiring layout and having homogeneous operation of each element.

A trench gate type insulated gate bipolar transistor includes: a first semiconductor layer having a first conductive type; a second semiconductor having a second conductive type and disposed on a surface of the first semiconductor layer; a third semiconductor having the first conductive type and disposed on a surface of the second semiconductor layer; a plurality of trenches penetrating the third semiconductor layer and reaching the second semiconductor layer, wherein the third semiconductor layer includes a plurality of first regions and a plurality of second regions, which are electrically separated by the trenches; a gate insulation film disposed on an inner wall of each trench; a gate electrode disposed on the gate insulation film in each trench; a fourth semiconductor layer having the second conductive type, wherein the fourth semiconductor layer is disposed in a surface portion of each first region of the third semiconductor layer and contacts each trench; a first electrode electrically connecting to the first region of the third semiconductor layer and the fourth semiconductor layer without connecting to the second region of the third semiconductor layer; and a second electrode electrically connecting to the first semiconductor layer. The first regions and the second regions are alternately arranged, and at least two second regions are continuously connected together so that the two regions are integrated into one body.

In the above transistor, the second regions in the third semiconductor layer, which is not electrically connected to the first region, are commonly integrated so that the integrated second regions have the same electric potential. Thus, the potentials of the second regions are prevented from deviating. Accordingly, operation of each element is uniformed.

Further, by integrating the second regions, a wiring for connecting the second regions is not necessary when the second regions are investigated at the same time. Thus, a degree of freedom of wiring layout becomes higher. Accordingly, the transistor has high degree of freedom of wiring layout and homogeneous operation of each element.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The inventors have preliminarily studied about a trench gate type insulated gate bipolar transistor (i.e., a trench gate type IGBT) as a comparison of the present invention.

Figure 6:
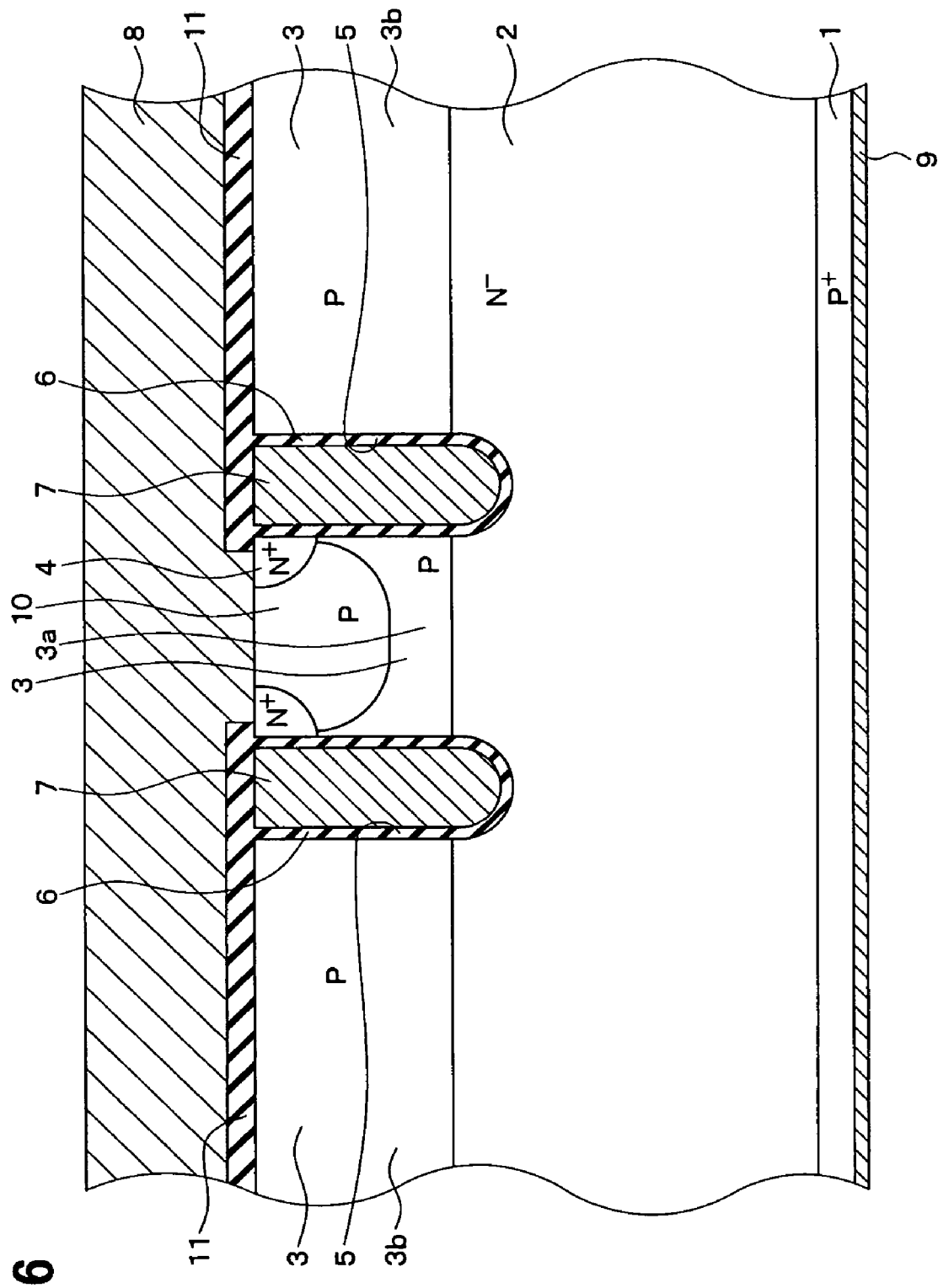
FIG. 6 is a cross sectional view showing an IGBT taken along line VI-VI in FIG. 7.

FIG. 6 is a cross section view of the IGBT having the so-called thinning structure. The cross section view is a view in a case of cutting trenches in a traverse way, and a structure of the left half or the right half the drawing is a unit structure. In the drawing, the left half and the right half are in a laterally symmetrical structure.

The IGBT has a $P^+$-type substrate 1, an $N^-$-type drift layer 2 disposed on a surface of the $P^+$-type substrate 1, a P-type base region 3 disposed on a surface of the $N^-$-type drift layer 2, $N^+$-type emitter regions 4 situated at an inner surface side of the P-type base region 3, trenches 5 in a depth from a surface of the P-type base region 3 to the $N^-$-type drift layer 2 through the $N^+$-type emitter regions 4 and the P-type base region 3, gate insulating films 6 formed on inner walls of the trenches 5, gate electrodes 7 formed within the trench 5 and on the gate insulating film 6, an emitter electrode 8 disposed on the surface of the P-type base region 3 and electrically connected to a part of the P-type base region 3 and the $N^+$-type emitter regions 4, and a collector electrode 9 disposed immediately on a back of the $P^+$-type substrate 1 and electrically connected to the $P^+$-type substrate 1.

In the IGBT, the P-type base region 3 is electrically divided into two types of first and second regions 3a and 3b (i.e., a first region 3a and a second region 3b) by the trenches 5, and the $N^+$-type emitter regions 4 and a P-type body region 10 are formed in only one first region 3a between the two types of first and second first regions 3a and 3b. The first region 3a is electrically connected to the emitter electrode 8 via the P-type body region 10. The $N^+$-type emitter regions 4 are disposed partially in a region near the trenches 5 in the first region 3a and channels are formed in portions where the first region 3a is contacted to the trenches 5. The first region 3a in which an IGBT element is formed in this way corresponds to the cell region.

Between the two types of first and second first regions 3a and 3b, the second region 3b is electrically insulated from the emitter electrode 8 and other electrodes by an insulating film 11, and consequently in an electrically floating state. The second regions 3b are regions where the certain cell regions are thinned out from the plurality of continuous cell regions.

Figure 7:
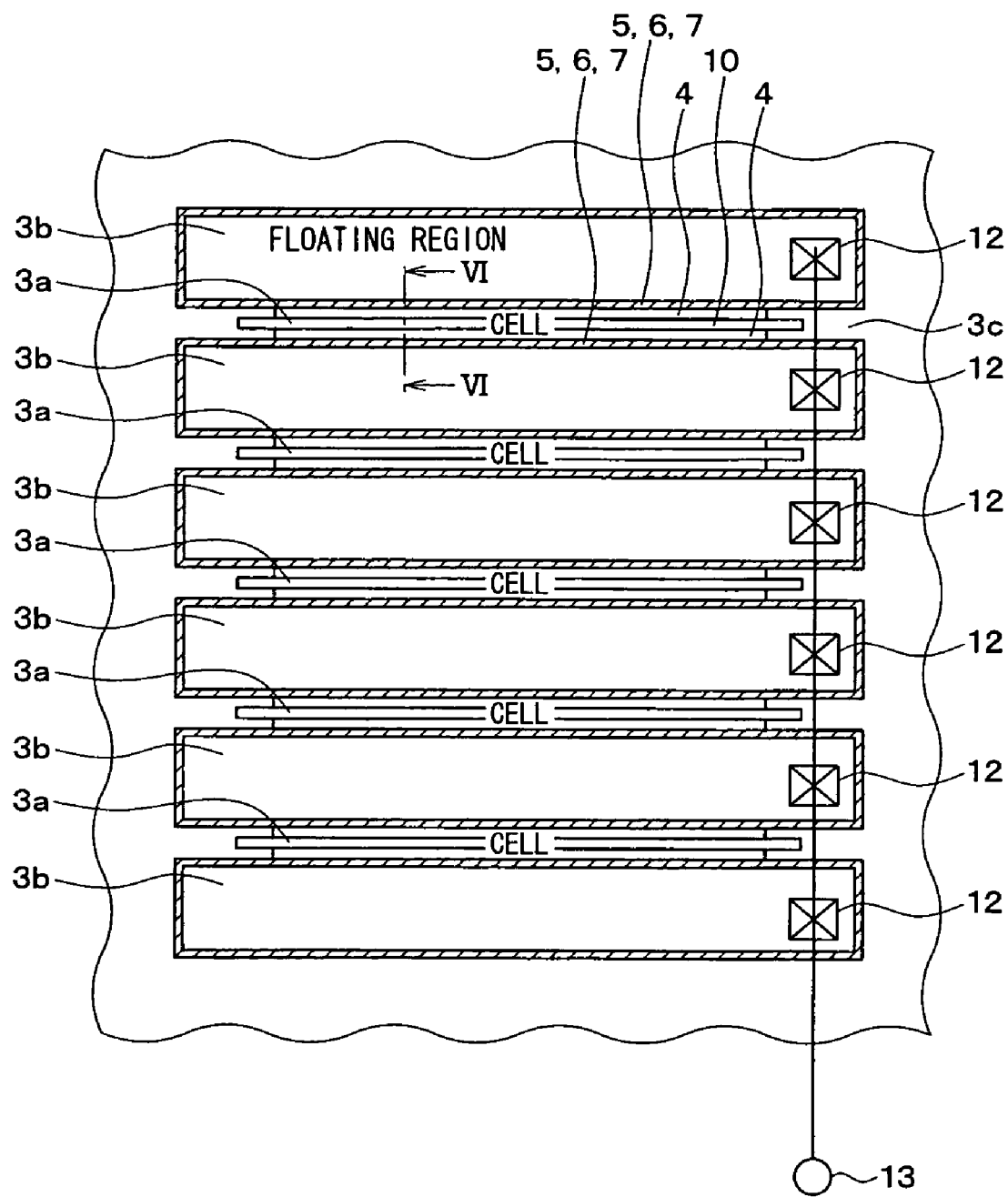
FIG. 7 is a plan view showing an IGBT according to a comparison of the present invention.

As a plane layout of the IGBT having the structure, the following layout is considered. FIG. 7 shows an example of the plane layout of the IGBT. A cross section view along a line VI-VI in FIG. 7 is FIG. 6.

In the layout shown in FIG. 7, a plurality of first regions 3a and second regions 3b of the P-type base regions 3 are alternately disposed in a stripe pattern, and each of the second regions 3b is enclosed by the trench 5.

Here, the trench 5 enclosing each of the second regions 3b is extension of a trench forming a trench gate. The $N^+$-type emitter regions 4 and the P-type body region 10 are disposed in the first region 3a, which configure the cell. In the figure, in two laterally sides adjacent to the cell region, hole extraction portions 3c are disposed. The hole extraction portion 3c is configured by a P-type well as the first region 3a, and electrically connected to the emitter electrode 8 via the P-type body region 10.

In the layout shown in FIG. 7, two unit structures that are to be laterally symmetric as shown in FIG. 6 are configured in a region including one of the second regions 3b, one of the first regions 3a, and another one of the second regions 3b, which are continuously disposed vertically in the figure. Moreover, in the layout shown in FIG. 7, the hole extraction portions 3c are formed as a continuous, single region.

In this way, as one of structures of the IGBT, a structure may be considered, in which each of the second regions 3b is enclosed by the trench 5, thereby each of the second regions 3b is configured by an independent P-type well and electrically isolated from the first regions 3a or the second regions 3b.

However, when the IGBT is formed in the layout structure shown in FIG. 7, the following two difficulties may be considered to arise.

That is, since each of the second regions 3b is separated, electrical potential of each of the second regions 3b is sometimes varied, for example, during switching operation of the IGBT. Therefore, a difficulty that operation of each cell within an IC chip becomes uneven may arise.

When a floating condition of each of the second regions 3b is tested, since a plurality of second regions 3b are tested at the same time, a method may be considered, in which each of the second regions 3b is provided with a contact 12, and the second regions 3b are electrically connected to each together by metal wiring such as Al wiring as shown in FIG. 7. Thus, for example, one test pad 13 that has been electrically connected to the second regions 3b is electrically connected to a tester, thereby a test can be easily performed.

However, when a special wiring line for electrically connecting the second regions 3b to each together is provided within the IC chip, since restriction is caused in a layout of other wiring lines, a difficulty of decrease in degree of freedom may arise in a wiring layout.

Even when each of the second regions 3b of the P-type base regions 3 is configured by a separated P-type well enclosing each of the second regions 3b by the trench 5, and separating the P-type wells forming respective second regions 3b from one another, the difficulties may arise again.

First Embodiment

Figure 1:
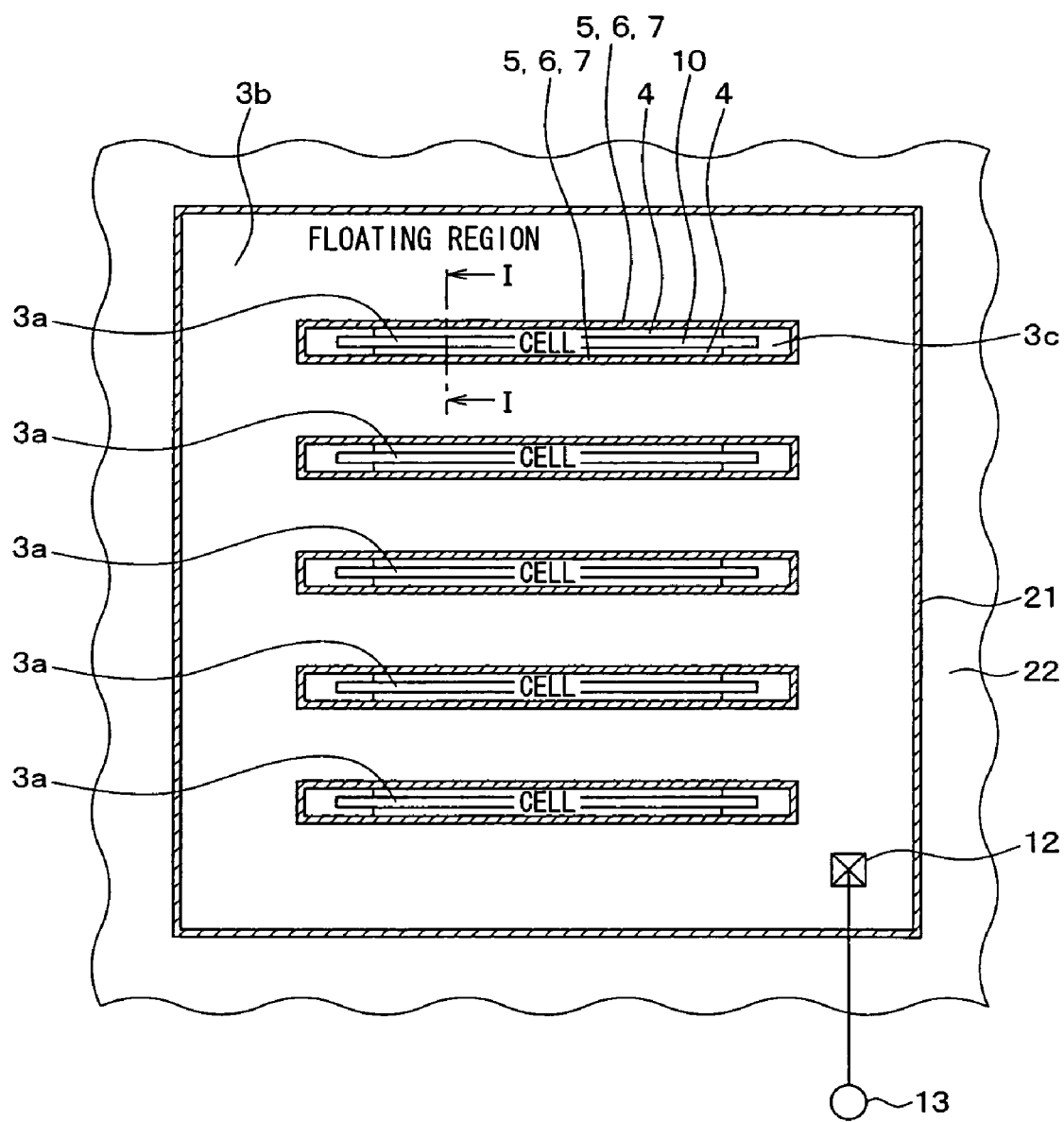
FIG. 1 is a plan view showing an IGBT according to a first embodiment of the present invention.

In view of the above problem, a trench gate type IGBT according to a first embodiment of the present invention is provided. FIG. 1 shows a plane layout of IGBT in the first embodiment of the invention. FIG. 1 shows a layout of a block among a plurality of blocks provided in an IC chip. The block means a region in which a plurality of cell regions are collected, and all the gate electrodes 7 are electrically connected by electric wiring in the block.

In FIG. 1, the same components as in FIG. 7 are marked with the same signs as in FIG. 7. Since a sectional structure along a line I-I in FIG. 1 is the same as the structure shown in FIG. 6, hereinafter, description is omitted on the sectional structure along the line I-I in FIG. 1.

A correspondence relationship between the embodiment and the invention is as follows. The P-type corresponds to a first conduction type, and the N-type corresponds to a second conduction type. The P$^+$-type substrate 1 corresponds to a first semiconductor layer, the N$^-$-type drift layer 2 corresponds to a second semiconductor layer, the P-type base region 3 corresponds to a third semiconductor layer, and N$^+$-type emitter region 4 corresponds to a fourth semiconductor layer. The emitter electrode 8 corresponds to a first electrode, and the collector electrode 9 corresponds to a second electrode.

In the IGBT of the embodiment, for example, a silicon (Si) substrate is used for the P$^+$-type substrate 1. A silicon oxide film (SiO$_2$ film) is used for the gate insulating film 6. Polysilicon (Poly-Si) that is doped with phosphorous (P) in high concentration and thus reduced in resistance is used for the gate electrode 7.

The plane layout of the IGBT of the embodiment is a layout in which a pattern of the second regions 3b is changed from a plurality of strip patterns to a continuous, single pattern with respect to the layout shown in FIG. 7.

Specifically, as shown in FIG. 1, in the embodiment, the first regions 3a between two types of regions which have been electrically divided by the trenches 5 in the P-type base regions 3, and the second regions 3b are alternately disposed in the stripe pattern as the layout shown in FIG. 7.

In the embodiment, unlike the layout shown in FIG. 7, each of a plurality of first regions 3a is enclosed by the trench 5, and the second regions 3b are formed as a continuous single region.

As shown in FIG. 1, the first region 3a is in a laterally extending strip pattern, and the N$^+$-type emitter regions 4 and the P-type body region 10 are disposed in an inner surface side as the layout shown in FIG. 7. A cell is configured by the first region 3a, N$^+$-type emitter regions 4, and P-type body region 10.

In two laterally sides of the first region 3a in the figure, a hole extraction portions 3c are disposed. The hole extraction portion 3c is in a configuration where the N$^+$-type emitter regions 4 are omitted with respect to the first region 3a, and electrically connected to the emitter electrode 8 via the P-type body region 10. The hole extraction portion 3c is a region for extracting holes to prevent avalanche current flow into the cell when avalanche breakdown occurs.

The trench 5 is disposed in a manner of completely enclosing one of the first regions 3a, and the hole extraction portion 3c situated in both adjacent sides of the first region 3a. As shown in FIG. 6, the gate insulating film 6 and the gate electrode 7 are formed within the trench 5. The second region 3b is electrically separated from the first region 3a by the trench 5.

The second regions 3b are in a pattern where, with respect to the second regions 3b disposed in a plurality of strip patterns in FIG. 7, the second regions 3b opposed to each other with the cell region between them are connected at both ends of them. In other words, the plane layout of FIG. 1 is a layout where a plurality of first regions 3a, each of which are smaller than the second region 3b, are separately disposed in the second region 3b. In this way, in the embodiment, the second region 3b is disposed in a manner of completely enclosing one of the first regions 3a.

Around the outermost circumference of the second region 3b, an outermost circumference trench 21 is disposed in a way of completely enclosing the second region 3b. Within the outermost circumference trench 21, while not shown, a silicon oxide film as an insulating film and the polysilicon that has been doped with phosphorous (P) in high concentration and thus reduced in resistance are disposed. The outermost circumference trench 21 electrically separates the second region 3b from a P-type well 22 situated around the outer circumference of the second region 3b.

While the polysilicon is not electrically connected to the gate electrode 7, the insulating film and the polysilicon are formed concurrently, for example, with the gate insulating film 6 and the gate electrode 7.

A contact portion 12 for electrically connecting between the second region 3b and a test pad 13 is provided in a certain area of the second region 3b, and the contact portion 12 is electrically connected to the test pad 13 by electric wiring. In this way, the test pad 13 is electrically connected to a tester, thereby a test on a floating condition of the second regions 3b in one block is performed. In the embodiment, since the second regions 3b are unified in one block within the IC chip, at least one contact portion 12 is provided, thereby the test on the floating condition of the second regions 3b in one block can be easily performed.

Next, main features of the embodiment are described.

As described before, as shown in FIG. 6, the IGBT of the embodiment is in a structure having cell regions and regions where certain cell regions are thinned out from a plurality of cell regions, that is, a structure having the two types of first and second regions 3a, 3b which are electrically divided by the trench 5 within the P-type base region 3, and in a layout where a plurality of the two types of first and second regions 3a, 3b are alternately disposed in a block within an IC chip. In addition, the second regions 3b of the two types of regions are formed as a continuous, single region over the whole area in one block.

Thus, floating potential of the second regions 3b can be made common within one block. Therefore, compared with a case where a plurality of the second regions 3b are separated from each together by enclosing each of the second regions 3b by the trenches 5 as the layout shown in FIG. 7, variation in potential of the second regions 3b can be suppressed. As a result, a phenomenon that operation of each cell becomes uneven within one block can be suppressed.

According to the embodiment, the floating potential of the second regions 3b can be made common within one block without using electric wiring. Therefore, even if a floating test on the second regions 3b is performed to a plurality of second regions 3b at the same time, the electric wiring for electrically connecting the second regions 3b to one another, which are necessary in the layout structure shown in FIG. 7, can be omitted. As a result, the degree of freedom of the wiring layout can be improved compared with the case of the layout shown in FIG. 7.

Second Embodiment

Figure 2:
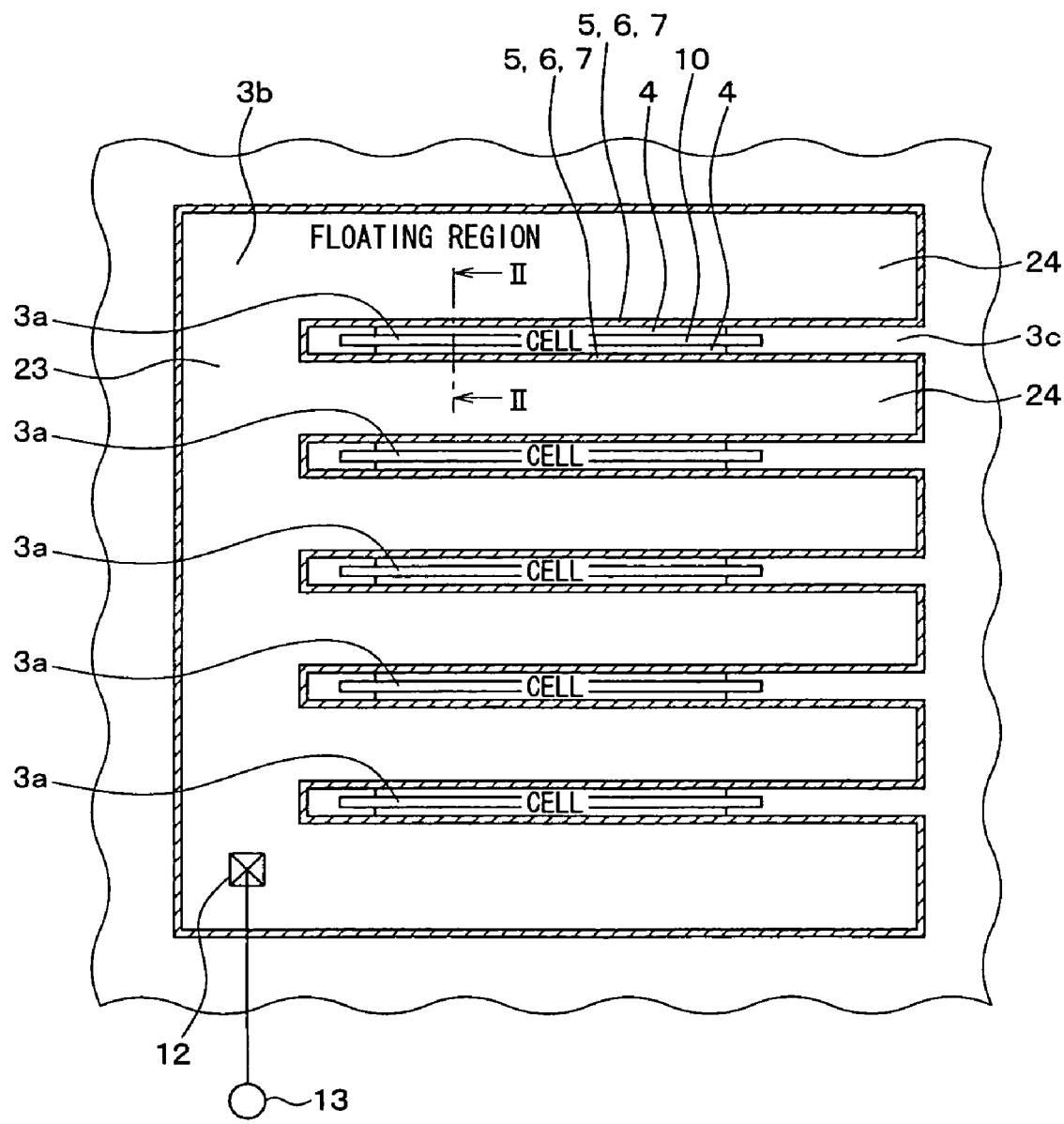
FIG. 2 is a plan view showing an IGBT according to a first example of a second embodiment of the present invention.
Figure 3:
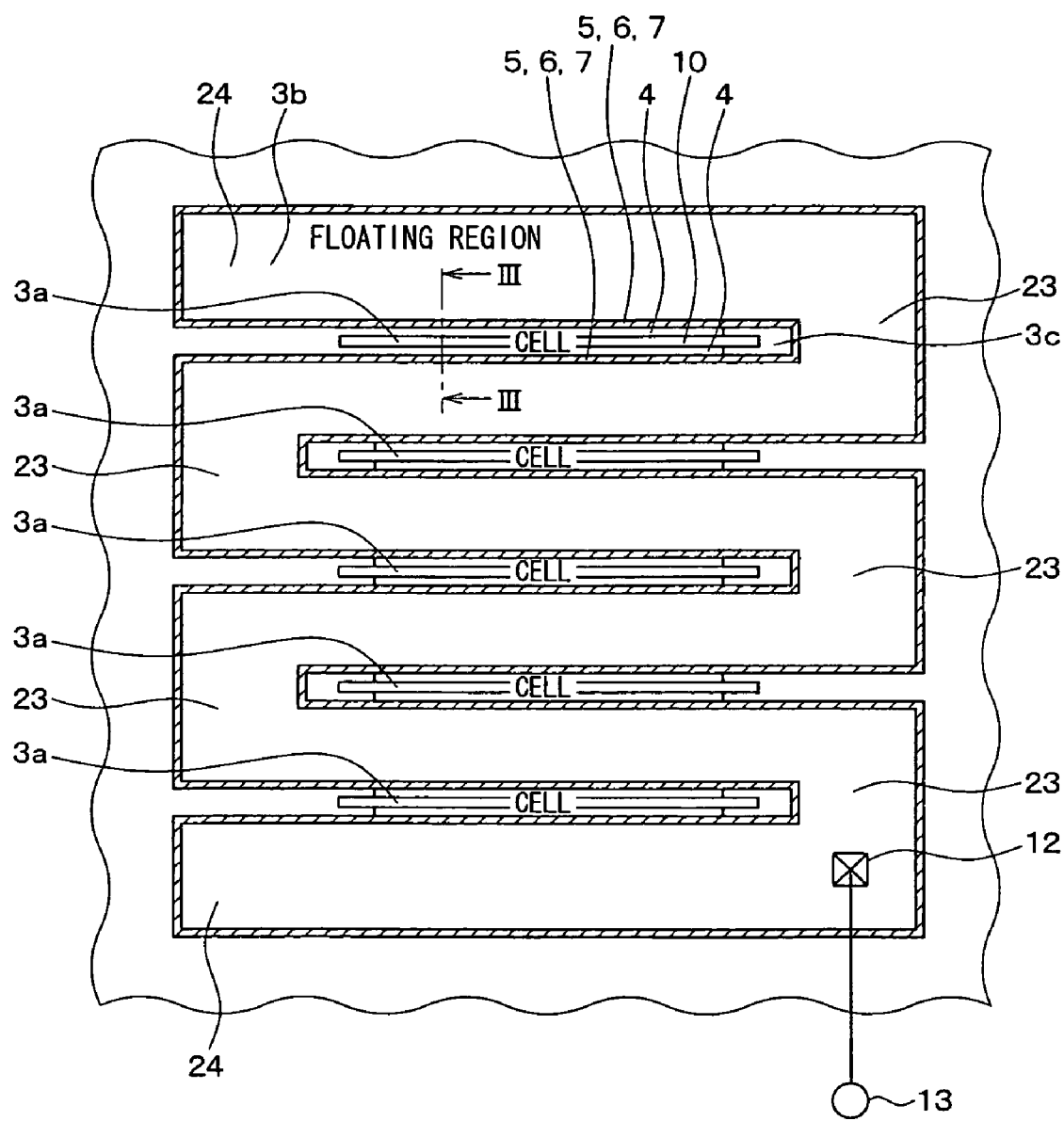
FIG. 3 is a plan view showing an IGBT according to a second example of the second embodiment of the present invention.

FIG. 2 shows a plane layout of IGBT in a first example of a second embodiment of the invention. FIG. 3 shows a plane layout of IGBT in a second example of the second embodiment of the invention. In FIGS. 2 and 3, the same components as components in FIG. 1 are marked with the same signs as in FIG. 1. Sectional structures along line II-II in FIG. 2 and line III-III in FIG. 3 are the same as the structure shown in FIG. 6.

In the first embodiment, as the layout for forming the second regions 3b into the continuous single region, a case was described as an example, wherein in the plurality of second regions 3b disposed in the strip patterns as shown in FIG. 7, the second regions 3b, which are disposed in a manner of facing each other with one first region 3a between them, are connected to each other at two lateral ends of them in the figure.

On the contrary, as the embodiment, as the layout for forming the second regions 3b into the continuous single region a pattern can be used, wherein in the plurality of second regions 3b disposed in the strip patterns in FIG. 7, the second regions 3b, which are disposed in a manner of facing each other with one first region 3a between them, are connected to each other only at one-end sides of them.

For example, a pattern of the second regions 3b can be made in such a pattern that all the plurality of the second regions 3b in FIG. 7 are connected to each together at respective left ends as shown in FIG. 2. That is, the pattern of the second regions 3b can be made like an E-shape pattern.

Moreover, for example, as shown in FIG. 3, the pattern of the second regions 3b can be made in such a pattern that the plurality of the second regions 3b in FIG. 7 are connected at one end sides, and connection portions 23 of them are situated left and right alternately in a vertical direction in the figure. That is, the pattern of the second regions 3b can be made like an S-shape pattern.

Again in this embodiment, since the second regions 3b are formed into the continuous single region, the same advantages as in the first embodiment are exhibited.

However, when the first and second embodiments are compared, while the second regions 3b are disposed in a way that they completely enclose one of the first regions 3a in the first embodiment, the second regions 3b are not disposed in a way that they completely enclose one of the first regions 3a in the second embodiment. Therefore, from the viewpoint of stability of the floating potential of the second regions 3b, the layout in the first embodiment is more preferable. The reason for this is as follows: in the case of the second embodiment, potential tends to be unstable at an end 24 of the second region 3b, at which one second region 3b is not connected to the second region 3b that is opposed thereto with the first region 3a between them, compared with the connection portion 23.

Figure 4:
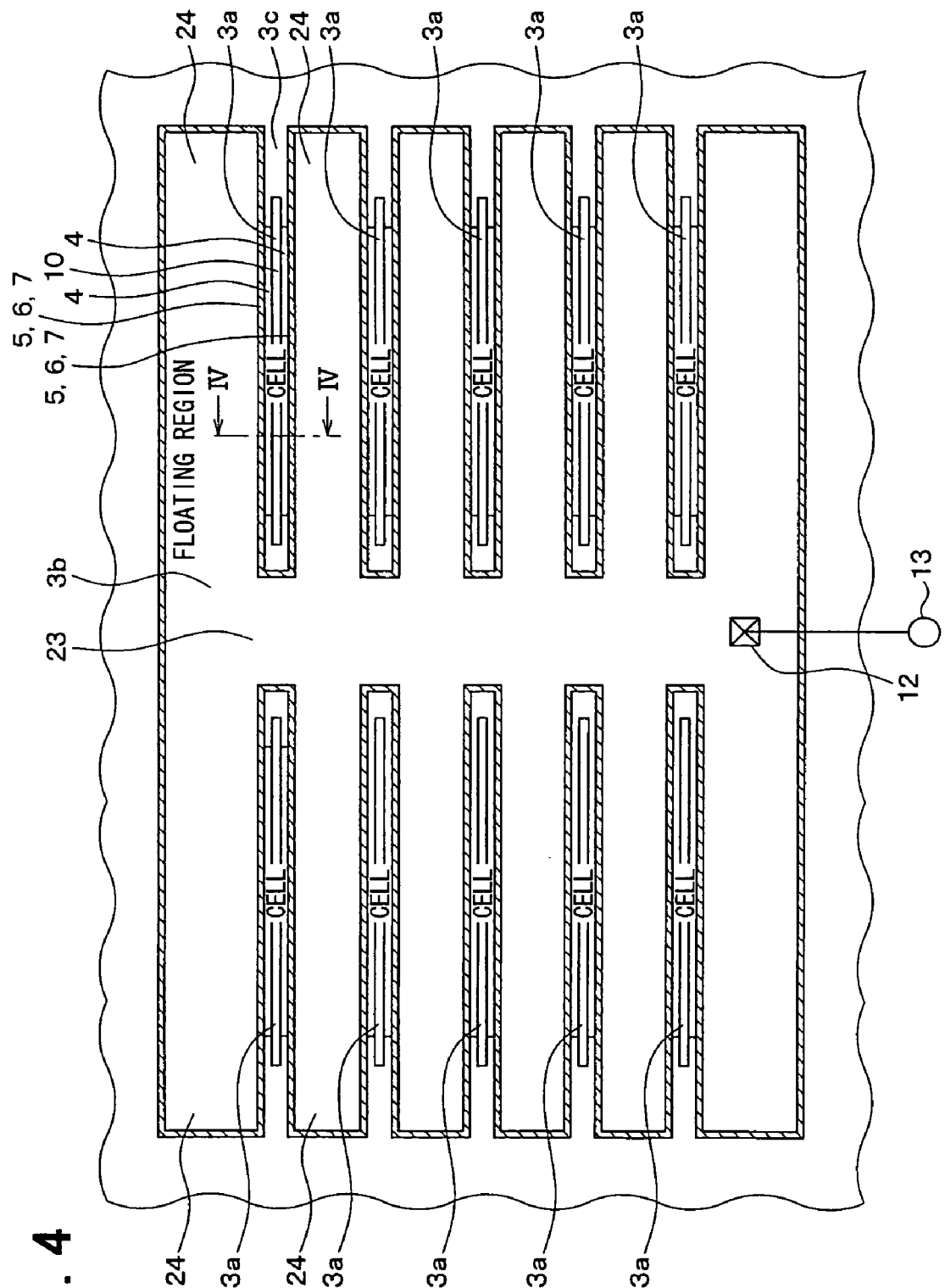
FIG. 4 is a plan view showing an IGBT according to a first example of modifications of the present invention.

MODIFICATIONS (1) FIG. 4 shows a plane layout of IGBT in a first example of modifications of the invention. In FIG. 4, the same components as components in FIGS. 1 and 2 are marked with the same signs as in FIGS. 1 and 2. A sectional structure along a line IV-IV in FIG. 4 is the same as the structure shown in FIG. 6.

As shown in FIG. 4, the plane layout of the IGBT can be made to be a layout where the second region 3b and first regions 3a in FIG. 2 are disposed in a laterally symmetric manner with a left end of the second region 3b in FIG. 2 as an axis.

Figure 5:
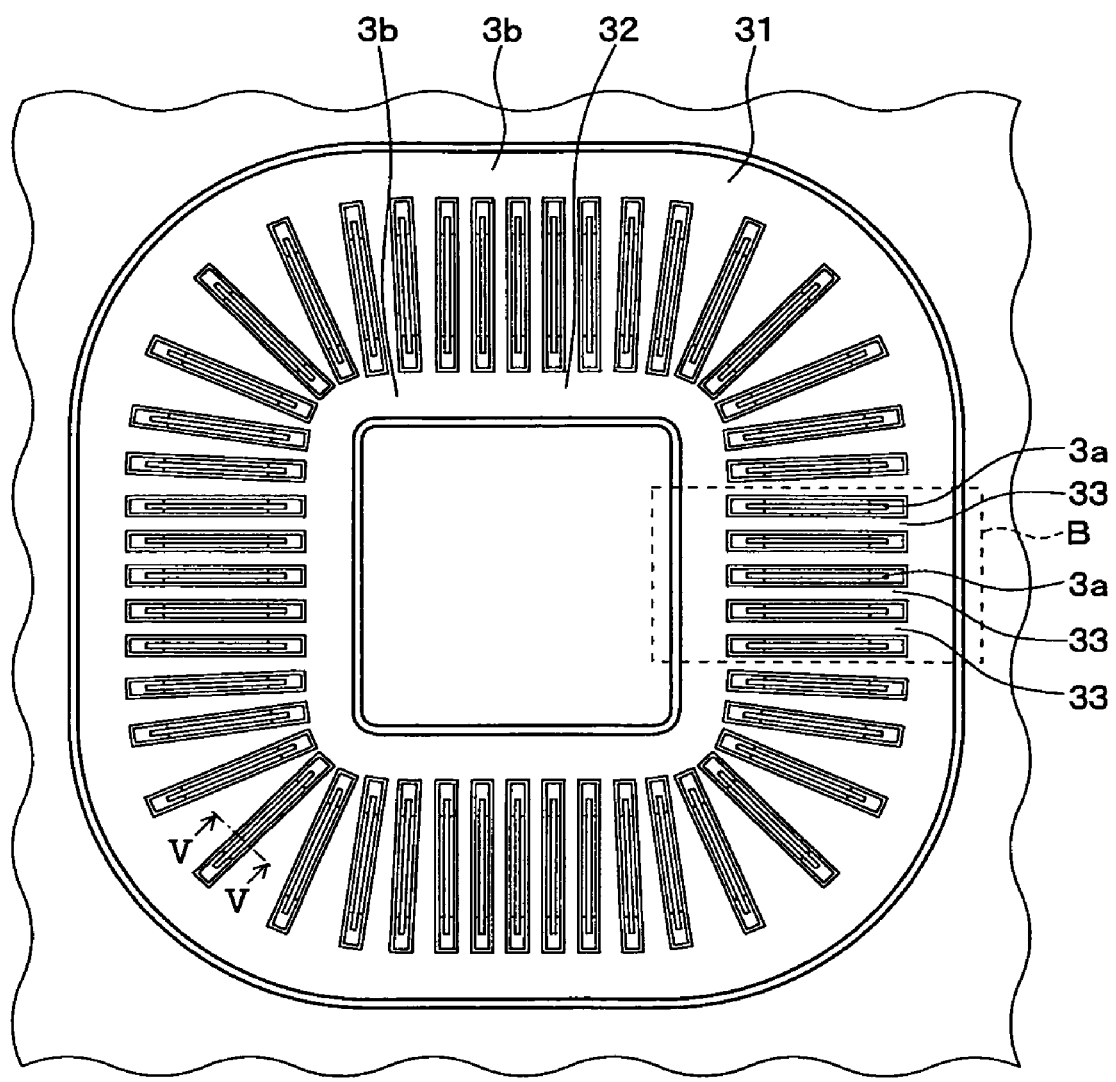
FIG. 5 is a plan view showing an IGBT according to a second example of modifications of the present invention.

(2) FIG. 5 shows a plane layout of IGBT in a second example of modifications of the invention. In FIG. 5, the same components as components in FIG. 1 are marked with the same signs as in FIG. 1. A sectional structure along a line V-V in FIG. 5 is the same as the structure shown in FIG. 1. A region B enclosed by a dashed line in FIG. 5 corresponds to the structure shown in FIG. 1.

As shown in FIG. 5, the plane layout of the IGBT can be made to be a layout where the second regions 3b in a pattern shown in FIG. 1 are continuously disposed in an approximately square frame pattern.

In other words, the second regions 3b can be made in a pattern including a first frame portion 31 disposed in an approximately square frame pattern, a second frame portion 32 that is disposed inside the first frame portion 31 and is in an approximately square frame pattern smaller than that of the first frame portion 31, and a plurality of connection portions 33 for connecting between the first frame portion 31 and the second frame portion 32. In this case, the first regions 3a are disposed between the first frame portion 31 and the second frame portion 32, and between adjacent connection portions 33.

(3) While the plane layout of the IGBT was described using a case that the first regions 3a and the second regions 3b are disposed in a stripe pattern as an example, other layouts can be used.

For example, a layout can be used, wherein the first regions 3a forming cells are in a hexagonal pattern, and the second regions 3b are disposed around the outer circumferences of the first regions 3a.

(4) While a plane layout in one block among a plurality of blocks disposed within the IC chip was described in each of the embodiments, a layout of the first regions 3a and the second regions 3b in the whole area within the IC chip can be used as the layout of each of the embodiments.

For example, even if the inside of the IC chip is divided into a plurality of blocks, the second regions 3b in each block can be formed into the continuous single region in the whole area within the IC chip. Moreover, when the inside of the IC chip is not divided into the plurality of blocks, the second regions 3b can be formed into the continuous single region in the whole area within the IC chip.

(5) While a case that the second regions 3b are in the continuous single pattern over the whole area of one block within the IC chip was described as an example in each of the embodiments, the second regions 3b can be formed into the continuous single pattern not only in the whole area, but also in a partial area.

For example, with respect to a layout where a plurality of the first regions 3a and a plurality of second regions 3b are alternately disposed in a stripe pattern as shown in FIG. 6, two second regions 3b disposed with one of the first regions 3a between them can be formed into the continuous single pattern.

Moreover, among the plurality of second regions 3b in FIG. 6, not only the two second regions 3b disposed with the first region 3a between them, but also at least two second regions 3b can be formed into the continuous single pattern.

Again in this way, in the second regions 3b formed into the continuous single region, electric wiring for electrically connecting among a plurality of second regions 3b can be omitted unlike a case that the plurality of second regions 3b are not continued as shown in FIG. 6.

(6) While such a case that the hole extraction portion 3c is configured by the P-type well as the partial area 3a of the P-type base area 3 was described as an example in each of the embodiments, the portion can be configured by a P$^+$-type layer having higher impurity concentration than that of the P-type well for preventing latch-up.

(7) In the first example, a case that the outermost circumference trench 21 is disposed around the outermost circumference of the second region 3b is disposed, thereby the second region 3b is electrically separated from the P-type well 22 disposed around the outer circumference of the second region 3b was described as an example. On the contrary, instead of providing the outermost circumference trench 21, a P-type well configuring the second region 3b is separated from a P-type well 22 situated around the outer circumference of the second region 3b, thereby the second region 3b can be electrically separated from the P-type well 22 situated around the outer circumference of the second region 3b.

(8) The structure of the IGBT can be made to be a structure where an N-type layer having higher impurity concentration than that of the N⁻-type drift layer 2 is added between the P⁺-type substrate 1 and the N⁻-type drift layer 2 with respect to the IGBT shown in FIG. 1.

(9) While a case that the first conduction type is the P-type, and the second conduction type is the N-type was described as an example in each of the embodiments, the first conduction type can be the N-type, and the second conduction type can be the P-type. That is, all conduction types in respective components of the IGBTs can be made to be opposite conduction types to one another.

The present invention has the following aspects.

A trench gate type insulated gate bipolar transistor includes: a first semiconductor layer having a first conductive type; a second semiconductor having a second conductive type and disposed on a surface of the first semiconductor layer; a third semiconductor having the first conductive type and disposed on a surface of the second semiconductor layer; a plurality of trenches penetrating the third semiconductor layer and reaching the second semiconductor layer, wherein the third semiconductor layer includes a plurality of first regions and a plurality of second regions, which are electrically separated by the trenches; a gate insulation film disposed on an inner wall of each trench; a gate electrode disposed on the gate insulation film in each trench; a fourth semiconductor layer having the second conductive type, wherein the fourth semiconductor layer is disposed in a surface portion of each first region of the third semiconductor layer and contacts each trench; a first electrode electrically connecting to the first region of the third semiconductor layer and the fourth semiconductor layer without connecting to the second region of the third semiconductor layer; and a second electrode electrically connecting to the first semiconductor layer. The first regions and the second regions are alternately arranged, and at least two second regions are continuously connected together so that the two regions are integrated into one body.

In the above transistor, the second regions in the third semiconductor layer, which is not electrically connected to the first region, are commonly integrated so that the integrated second regions have the same electric potential. Thus, the potentials of the second regions are prevented from deviating. Accordingly, operation of each element is uniformed.

Further, by integrating the second regions, a wiring for connecting the second regions is not necessary when the second regions are investigated at the same time. Thus, a degree of freedom of wiring layout becomes higher. Accordingly, the transistor has high degree of freedom of wiring layout and homogeneous operation of each element.

Alternatively, one of a plurality of second regions may completely surround one of a plurality of first regions. Thus, the electric potential of the second regions becomes stable.

Alternatively, at least a part of a plurality of second regions in an area adjacent to the gate electrode may be integrated into one body, the gate electrode electrically connected with a wiring. Thus, in an IC chip including the transistor, the second regions in one block of the IC chip are integrated into one body. Thus, the electric potential of the second regions becomes much stable.

Alternatively, a plurality of second regions in whole area may be integrated into one body. Alternatively, all of the second regions may be integrated into one body so that the one body of the second regions surrounds each first region completely. Alternatively, all of the second regions may be integrated into one body so that the one body provides a comb-teeth shape having a plurality of comb-teeth and a comb-body, and each first region is surrounded with adjacent two comb-teeth and the comb-body. Alternatively, all of the second regions may be integrated into one body so that the one body provides a zigzag pattern, and each first region is sandwiched in the zigzag pattern. Alternatively, all of the second regions may be integrated into one body so that the one body provides a plurality of teeth and an elongated body. The teeth are protruded from both sides of the elongated body, and each first region is surrounded with adjacent two teeth and the elongated body so that the first region is disposed on one of two sides of the elongated body. Alternatively, all of the second regions may be integrated into one body so that the one body provides a donut shape having a center opening and a ring portion, and each first region is disposed in the ring portion of the donut shape so that the first region is surrounded with the one body of the second regions completely.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A trench gate type insulated gate bipolar transistor comprising;
   a first semiconductor layer having a first conductive type;
   a second semiconductor layer having a second conductive type and disposed on a surface of the first semiconductor layer;
   a third semiconductor layer having the first conductive type and disposed on a surface of the second semiconductor layer;
   a plurality of trenches penetrating the third semiconductor layer and reaching the second semiconductor layer, wherein the third semiconductor layer includes a plurality of first regions and a plurality of second regions, which are electrically separated by the trenches;
   a gate insulation film disposed on an inner wall of each trench;
   a gate electrode disposed on the gate insulation film in each trench;
   a fourth semiconductor layer having the second conductive type, wherein the fourth semiconductor layer is disposed in a surface portion of each first region of the third semiconductor layer and contacts each trench;
   a first electrode electrically connecting to the first region of the third semiconductor layer and the fourth semiconductor layer without electrically connecting to the second region of the third semiconductor layer;
   a second electrode electrically connected to the first semiconductor layer; and
   an outer trench, wherein
   the first regions and the second regions are alternately arranged, at least two second regions are continuously connected together so that the two second regions are integrated into one body, and the outer trench surrounds the two second regions so that the two second regions are isolated.

2. The transistor according to claim 1, wherein one of a plurality of second regions completely surrounds one of a plurality of first regions.

3. The transistor according to claim 1, wherein at least a part of a plurality of second regions in an area adjacent to the gate electrode are integrated into one body, the gate electrode electrically connected with a wiring.

4. The transistor according to claim 1, wherein a plurality of second regions in whole area are integrated into one body.

5. The transistor according to claim 1 wherein all of the second regions are integrated into one body so that the one body of the second regions surrounds each first region completely.

6. The transistor according to claim 1, wherein
all of the second regions are integrated into one body so that the one body provides a comb-teeth shape having a plurality of comb-teeth and a comb-body, and
each first region is surrounded with adjacent two comb-teeth and the comb-body.

7. The transistor according to claim 1, wherein
all of the second regions are integrated into one body so that the one body provides a zigzag pattern, and
each first region is sandwiched in the zigzag pattern.

8. The transistor according to claim 1, wherein
all of the second regions are integrated into one body so that the one body provides a plurality of teeth and an elongated body,
the teeth are protruded from both sides of the elongated body, and
each first region is surrounded with adjacent two teeth and the elongated body so that the first region is disposed on one of two sides of the elongated body.

9. The transistor according to claim 1, wherein
all of the second regions are integrated into one body so that the one body provides a donut shape having a center opening and a ring portion, and
each first region is disposed in the ring portion of the donut shape so that the first region is surrounded with the one body of the second regions completely.

10. The transistor according to claim 1, wherein
all of the plurality of second regions are continuously connected together so that all of the plurality of second regions are integrated into one body,
the outer trench surrounds all of the plurality of second regions so that all of the plurality of second regions are isolated, and
all of the plurality of second regions provide a floating region.

11. The transistor according to claim 10, wherein the floating region does not function as a transistor.

* * * * *